(12) United States Patent
Lo et al.

(10) Patent No.: US 7,731,506 B2
(45) Date of Patent: Jun. 8, 2010

(54) PIN LAYOUT OF A GOLDEN FINGER FOR FLEXIBLE PRINTED CIRCUITBOARD

(75) Inventors: Chin-Wen Lo, Taichung (TW); Yueh-Fang Wang, Taichung (TW)

(73) Assignee: Wintek Corporation, Taichung (TW)

( * ) Notice: Subject to any disclaimer, the term of this patent is extended or adjusted under 35 U.S.C. 154(b) by 0 days.

(21) Appl. No.: 12/535,337

(22) Filed: Aug. 4, 2009

(65) Prior Publication Data

US 2010/0035446 A1 Feb. 11, 2010

(30) Foreign Application Priority Data

Aug. 5, 2008 (TW) .............................. 097129693

(51) Int. Cl.
*H01R 12/00* (2006.01)
(52) U.S. Cl. .......................................... 439/67; 439/59
(58) Field of Classification Search ................... 439/55, 439/59, 67, 77, 78; 361/749–751
See application file for complete search history.

(56) References Cited

U.S. PATENT DOCUMENTS

| 5,573,409 | A | * | 11/1996 | Shiley et al. | ............... | 439/76.1 |
| 6,802,721 | B2 | * | 10/2004 | Sanada et al. | .................. | 439/67 |
| 7,484,967 | B2 | * | 2/2009 | Ichino et al. | ................... | 439/67 |

* cited by examiner

*Primary Examiner*—Khiem Nguyen
(74) *Attorney, Agent, or Firm*—WPAT, PC; Justin King

(57) ABSTRACT

A pin layout of a golden finger for FPC is disclosed, which comprises: a substrate; a first conductive layer, having a plurality of first routings; a second conductive layer, having a plurality of second routings; and a plurality of conductive members; wherein the first and the second conductive layers are formed respectively on the two opposite sides of the substrate in a manner that each first routing is electrically connected to its corresponding first pin, while disposing a plurality of second pins, without contacting to the first pins and the first routings, on the side of the substrate where the first conductive layer is disposed for corresponding each of the second pins to the extensions of the plural second routings; and the plural conductive members are disposed forming electric connections between the second routings and the second pins in respective.

7 Claims, 4 Drawing Sheets

PIN LAYOUT OF A GOLDEN FINGER FOR FLEXIBLE PRINTED CIRCUITBOARD

FIELD OF THE INVENTION

The present invention relates to a pin layout of a golden finger for flexible printed circuitboard (FPC), and more particularly, to a FPC golden finger having pin layout with multi-layered routings.

BACKGROUND OF THE INVENTION

Generally, the pin layout of any conventional FPC golden finger is manufactured basing upon the dimensions defined in it complementary connectors' specifications that are currently available on the market, especially for the dimensions specifications regarding to pin width and pin pitches. For mating a FPC golden finger with its complementary connector perfectly without causing any shortage between the contact pins of the connector and the internal pins of the golden finger, the pin layout of the golden finger must be manufactured with high accuracy and minimized tolerance.

Following the trend that more and more connectors are designed with more pins for connection, the size of the golden finger is increasing consequently. Despite of the increasing size, for ensuring no erroneous contact between neighboring pins while inserting a large-sized golden finger into its complementary connector, such golden finger must be manufactured with high accuracy especially for its pin layout. However, the cost for some manufacturers to maintain such high manufacturing accuracy is low production yield. On the other hand, the trade off for other manufacturers capable of maintaining such manufacturing accuracy is that the manufacturing cost of FPC with such golden fingers is increased. In addition, the alternating routings of the pins formed on the golden finger may be damaged or even broken while the FPC is bended by an external force.

Please refer to FIG. 1A and FIG. 1B, which are a top view and a cross-sectional view of a conventional pin layout of a golden finger for flexible printed circuitboard. From top to bottom that the golden finger 1 is configured with a protective layer 10, a copper layer 11, a substrate 12, another copper layer 13, another protective layer 14, and a stiffening plate 15. It is noted that the interlaced pins on the golden finger 1 for mating with its complementary connector is formed by the etching of the copper layer 11, whereas the pins 111 are odd-numbered pins while the pins 112 are even-numbered pins. As shown in FIG. 1A, portions of those odd-numbered pins 111, as the portion 1110 enclosed by the dotted line for illustration, are narrowed to be arranged alternating with the even-numbered pins 112. However, since the aforesaid pin layout is without exception that it is troubled by the conventional problems regarding to manufacture accuracy and pin width, such thin routings at the portions 1110 can either be damaged or even broken while the FPC is bended by an external force, or cause shortage as they are easy to contact erroneously with their neighboring pins.

Please refer to FIG. 2A and FIG. 2B, which are a top view and a cross-sectional view of another conventional pin layout of a golden finger for flexible printed circuitboard. From top to bottom that the golden finger 2 is configured with a protective layer 20, a copper layer 21, a substrate 22, another copper layer 23, another protective layer 24, and a stiffening plate 25. It is noted that the pins of the golden finger 2, including the odd-numbered pins 211 and even-numbered pins 212, are formed by an electroplating means. Similarly, portions of those odd-numbered pins 211, as the portion 2110 as well as the thin lines formed in front of those pins enclosed by the dotted line for illustration, are narrowed to be arranged alternating with the even-numbered pins 212. However, since the aforesaid pin layout is without exception that it is troubled by the conventional problems regarding to manufacture accuracy and pin width, such thin routings at the portions 2110 can either be damaged or even broken while the FPC is bended by an external force, or cause shortage as they are easy to contact erroneously with their neighboring pins Therefore, it is in need of a FPC golden finger having pin layout with multi-layered routings.

SUMMARY OF THE INVENTION

The primary object of the present invention is to provide a pin layout of a golden finger for flexible printed circuitboard (FPC), being designed with multi-layered routings for enabling the golden finger to be manufactured by a manufacturing process with comparative lower accuracy as well as lower cost while capable of preventing the broken circuit in the golden finger from happening.

To achieve the above object, the present invention provides a pin layout of a golden finger for flexible printed circuitboard (FPC), comprising: a substrate; a first conductive layer, having a plurality of first routings; a second conductive layer, having a plurality of second routings; and a plurality of conductive members; wherein the first and the second conductive layers are formed respectively on the two opposite sides of the substrate in a manner that each of the plural first routing of the first conductive layer is electrically connected to its corresponding first pin, while disposing a plurality of second pins, without contacting to the first pins and the first routings, on the side of the substrate where the first conductive layer is disposed at locations other than those of the first pins for corresponding each of the second pins respectively to the extensions of the plural second routings located on the other side of the substrate; and the plural conductive members are disposed forming electric connections between the second routings and the second pins in respective.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1A:
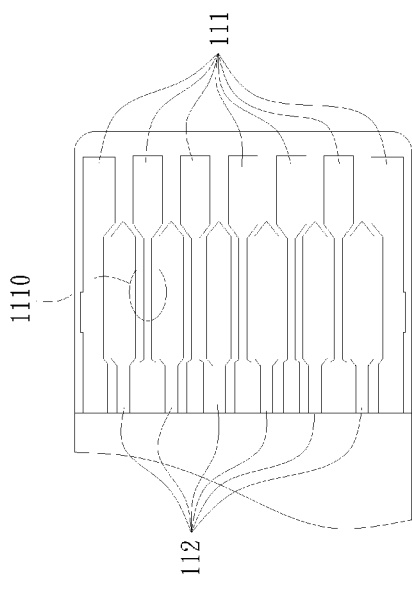
FIG. 1A is a top view of a conventional pin layout of a golden finger for flexible printed circuitboard.
Figure 1B:
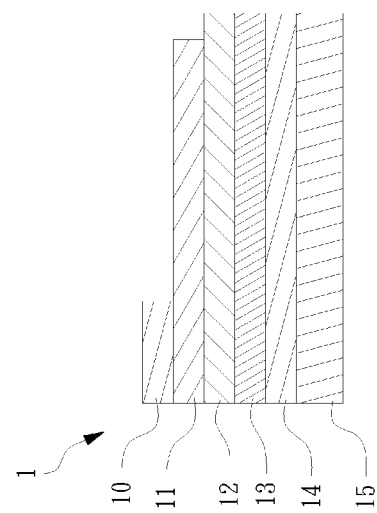
FIG. 1B is a cross-sectional view of FIG. 1A.
Figure 2A:
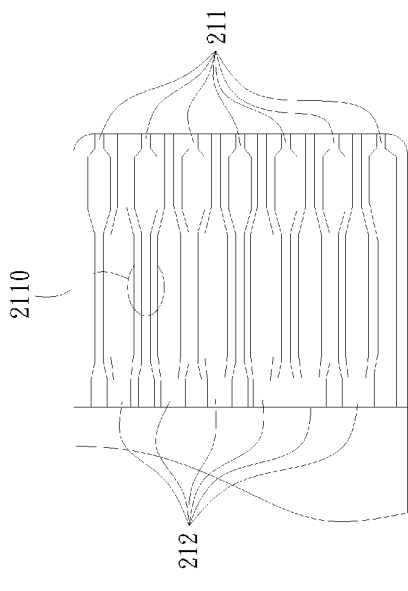
FIG. 2A is a top view of another conventional pin layout of a golden finger for flexible printed circuitboard.
Figure 2B:
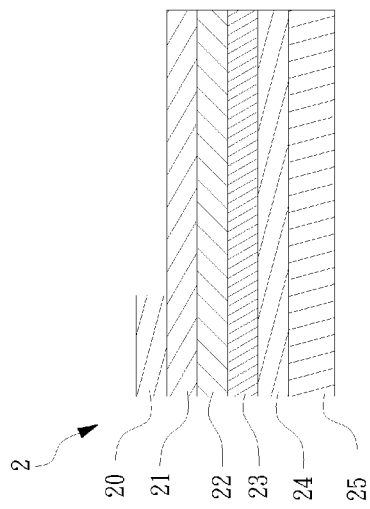
FIG. 2B is a cross-sectional view of FIG. 2A.
Figure 3A:
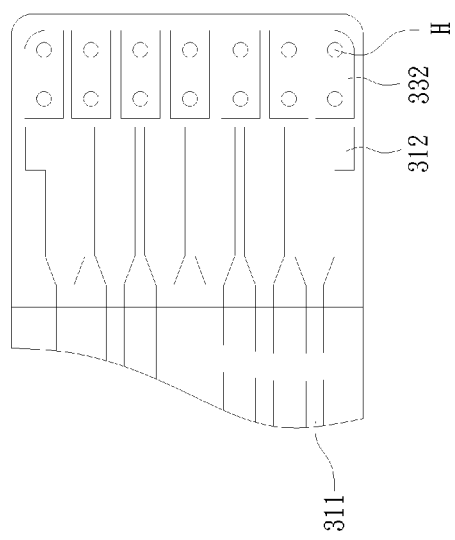
FIG. 3A is a top view of a golden finger for flexible printed circuitboard according to an exemplary embodiment of the invention showing the formation of its first conductive layer.
Figure 3B:
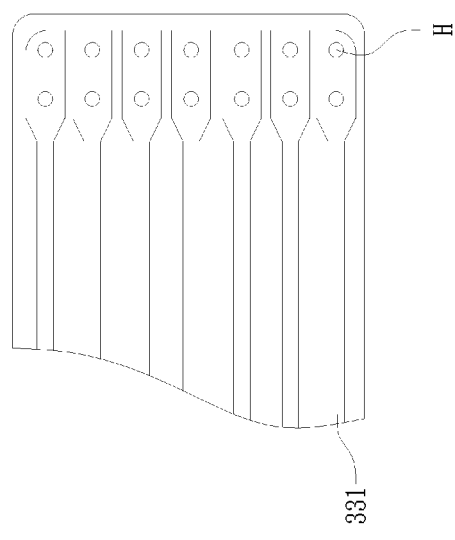
FIG. 3B is another top view of FIG. 3A showing its second conductive layer by removing all the other layers above the same.
Figure 3C:
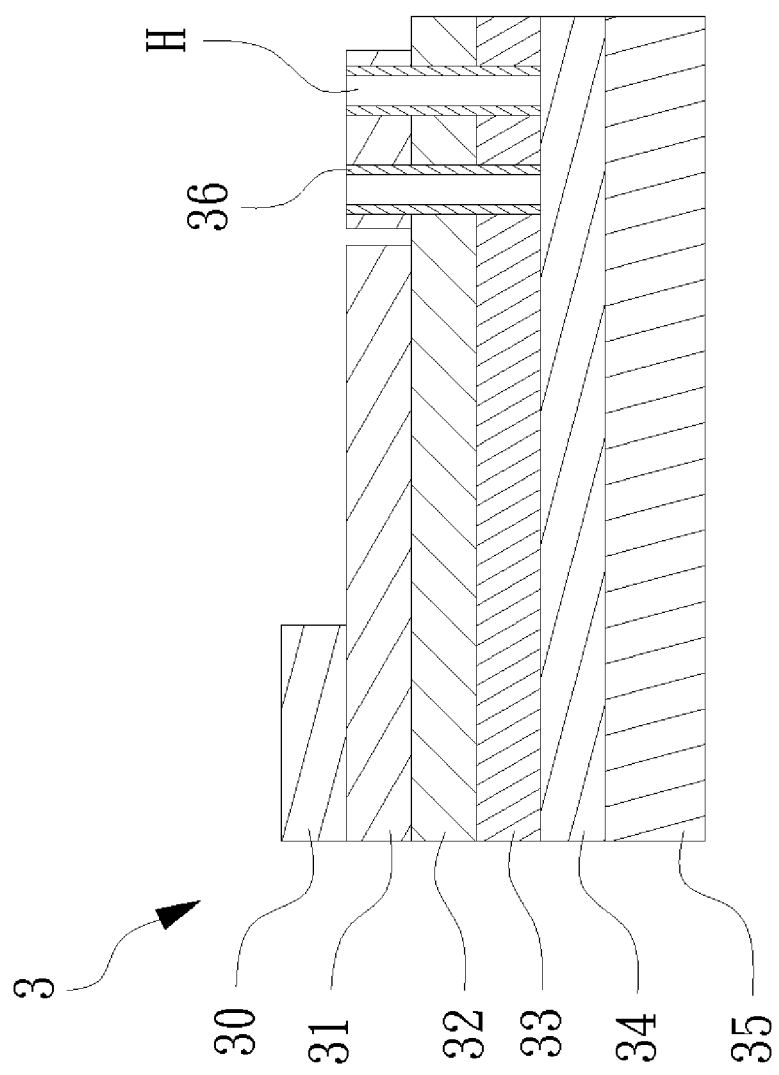
FIG. 3C is a cross-sectional view of FIG. 3A.

Please refer to FIG. 3A, FIG. 3B and FIG. 3C, which are a pin layout of a golden finger for flexible printed circuitboard according to an exemplary embodiment of the invention. From top to bottom that the golden finger 3 is configured with a first protective layer 30, a first conductive layer 31, a substrate 32, a second conductive layer 33, a second conductive protective layer 34, and a stiffening plate 35, in which the first and the second conductive layers 31 and 34 can be made of copper.

The first conductive layer 31 is configured with a plurality of first routings 311 in a manner that a portion of those first routings 311 is covered by the first protective layer 30 as those represented in the FIG. 3A by dotted lines, and the extending end of each of the plural first routings 311 that is not covered is connected to a corresponding first pin 312 while disposing a plurality of second pins 332, without contacting to the first pins 312, on the side of the substrate 32 where the first conductive layer 31 is disposed at locations other than those of the first pins 312.

As shown in FIG. 3B, the second conductive layer 33 is configured with a plurality of second routings 331 in a manner that the extensions of the plural second routings are located at positions corresponding to the plural second pins in respective. In addition, for enabling electric conduction, a plurality of via holes H are formed penetrating the second pins 332, the substrate 32 and the second conductive layer 33 while having a conductive member 36 to be disposed inside each of the via hole H, such as having a copper layer to be electroplated in each via hole H or having a conductive paste to be filled on each via hole H. By those conductive members 36, the second pins 332 can be electrically connected to their corresponding second routings 331 of the second conductive layer 33 for signal transmission. It is noted that the electric conduction between the second routings and the second pins of the invention is not limited by the abovementioned means. In addition, by the routing design, the pins can be divided into at least two groups which are electrically connected with different conductive layers by different conductive members so that it can achieve a pin layout structure with multi-layered routings.

Therefore, the aforesaid double-layered routing structure has the following advantages:

(1) The pin width of the pin on the golden finger of a FPC can be increased so that the structural integrity of the pin is enforced for preventing the pin from breaking.

(2) As the routings of different layers are independent with each other, the shortage of erroneous contacting between neighboring pins that is common for those conventional golden fingers can be prevented.

(3) Also as the routings of different layers are independent with each other, such pin layout for golden fingers can be manufactured by a manufacturing process with comparative lower accuracy so that its manufacturing cost can be reduced.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A pin layout of a golden finger for flexible printed circuitboard (FPC), comprising:
    a substrate;
    a first conductive layer, having a plurality of first routings;
    a second conductive layer, having a plurality of second routings; and
    a plurality of conductive members;
    wherein, the first and the second conductive layers are formed respectively on the two opposite sides of the substrate in a manner that each of the plural first routing of the first conductive layer is electrically connected to its corresponding first pin, while disposing a plurality of second pins, without contacting to the first pins and the first routings, on the same side of the substrate where the first conductive layer is disposed at locations other than those of the first pins for corresponding each of the second pins respectively to the extensions of the plural second routings located on the other side of the substrate; and the plural conductive members are disposed forming electric connections between the second routings and the second pins in respective.

2. The pin layout of claim 1, wherein the plural conductive members are at least a via hole, each having a metal layer formed therein while being formed penetrating through its corresponding second pin, the substrate and the second routing.

3. The pin layout of claim 1, wherein the plural conductive members are at least a via hole, each having a conductive paste disposed therein while being formed penetrating through its corresponding second pin, the substrate and the second routing.

4. The pin layout of claim 1, wherein a first protective layer is formed on the first conductive layer at positions covering the same while exposing the first pins and the second pins.

5. The pin layout of claim 1, wherein a second protective layer is formed on the second conductive layer at the side thereof not having contact with the substrate.

6. The pin layout of claim 1, wherein the plural first and the second pins are arranged in a front-to-rear staggered conformation.

7. The pin layout of claim 5, wherein a stiffening plate is formed on the second protective layer at the side thereof not having contact with the second conductive layer.

* * * * *